United States Patent
Lin et al.

(10) Patent No.: US 9,536,963 B2
(45) Date of Patent: Jan. 3, 2017

(54) ELECTRODE STRUCTURE OF A TRANSISTOR, AND PIXEL STRUCTURE AND DISPLAY APPARATUS COMPRISING THE SAME

(75) Inventors: Yu-Min Lin, Hsinchu (TW); Kuo-Lung Fang, Hsinchu (TW); Feng-Yuan Gan, Hsinchu (TW)

(73) Assignee: AU OPTRONICS CORP., Hsinchu (TW)

( * ) Notice: Subject to any disclaimer, the term of this patent is extended or adjusted under 35 U.S.C. 154(b) by 1702 days.

(21) Appl. No.: 11/683,131

(22) Filed: Mar. 7, 2007

(65) Prior Publication Data
US 2008/0067538 A1    Mar. 20, 2008

(30) Foreign Application Priority Data
Sep. 15, 2006 (TW) .............................. 95134287 A (51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 29/417* | (2006.01) |
| *G02F 1/1368* | (2006.01) |
| *H01L 29/786* | (2006.01) |
| *H01L 27/12* | (2006.01) |

(52) U.S. Cl.
CPC ....... *H01L 29/41733* (2013.01); *G02F 1/1368* (2013.01); *H01L 27/124* (2013.01); *H01L 29/78696* (2013.01)

(58) Field of Classification Search
CPC .............. G02F 1/1368; G02F 1/134363; H01L 29/41733; H01L 29/78696; H01L 29/42384; H01L 27/12; H01L 27/124
USPC ............................ 257/72, E29.117, E29.137
See application file for complete search history.

(56) References Cited

U.S. PATENT DOCUMENTS

| | | | |
|---|---|---|---|
| 5,003,356 A | 3/1991 | Wakai et al. | |
| 5,798,744 A * | 8/1998 | Tanaka et al. | 345/92 |
| 6,066,506 A | 5/2000 | Holmberg et al. | |
| 6,897,482 B2 | 5/2005 | Morita et al. | |
| 7,285,894 B1 * | 10/2007 | da Cunha | 310/313 A |

(Continued)

FOREIGN PATENT DOCUMENTS

JP    2000/196098    7/2000

OTHER PUBLICATIONS

Taiwanese language office action dated Jan. 27, 2010.
(Continued)

*Primary Examiner* — David Chen
(74) *Attorney, Agent, or Firm* — McClure, Qualey & Rodack, LLP (57) ABSTRACT

An electrode structure of a transistor, and a pixel structure and a display apparatus comprising the electrode structure of the transistor are disclosed. The electrode structure of the transistor comprises a first electrode and a second electrode. The first electrode has at least two first portions and at least one second portion. The first portions are substantially parallel with each other and each has a first width. The second portion has a second width, and connects the substantially parallel first portions to define a space with an opening. The first width is substantially greater than the second width.

15 Claims, 10 Drawing Sheets

(56) References Cited

U.S. PATENT DOCUMENTS

2001/0030719 A1* 10/2001 Yamaguchi ........... G02F 1/1368
                                                    349/43
2002/0145144 A1* 10/2002 Kane .................... G02F 1/1368
                                                    257/72
2004/0125250 A1     7/2004 Park
2005/0236615 A1    10/2005 Itoh et al.
2005/0272178 A1* 12/2005 Kim ................. G02F 1/136259
                                                    438/30
2007/0181877 A1*  8/2007 Lim ................... H01L 27/1288
                                                    257/59

OTHER PUBLICATIONS

English language translation of Taiwanese office action.
English language translation of abstract and pertinent part of JP 2000/196098 (published Jul. 14, 2000).

* cited by examiner

ELECTRODE STRUCTURE OF A TRANSISTOR, AND PIXEL STRUCTURE AND DISPLAY APPARATUS COMPRISING THE SAME

This application claims the benefit of priority based on Taiwan Patent Application No. 095134287 filed on Sep. 15, 2006 the disclosures of which are incorporated herein by reference in their entirety.

CROSS-REFERENCES TO RELATED APPLICATIONS

Not applicable.

BACKGROUND OF THE INVENTION

Field of the Invention

The present invention relates to an electrode structure of a thin-film transistor.

Descriptions of the Related Art

In recent years, developments for flat panel displays have grown rapidly and traditional cathode radiation tube displays have been gradually replaced. Nowadays, major flat panel displays include: Organic Light-Emitting Diodes Displays (OLEDs), Plasma Display Panel (PDP), Liquid Crystal Displays (LCDs), and Field Emission Displays (FEDs). One of the key components of these flat panel displays includes a thin-film transistor (TFT) so as to control the turn on/off each pixel within these flat panel displays.

Figure 1:
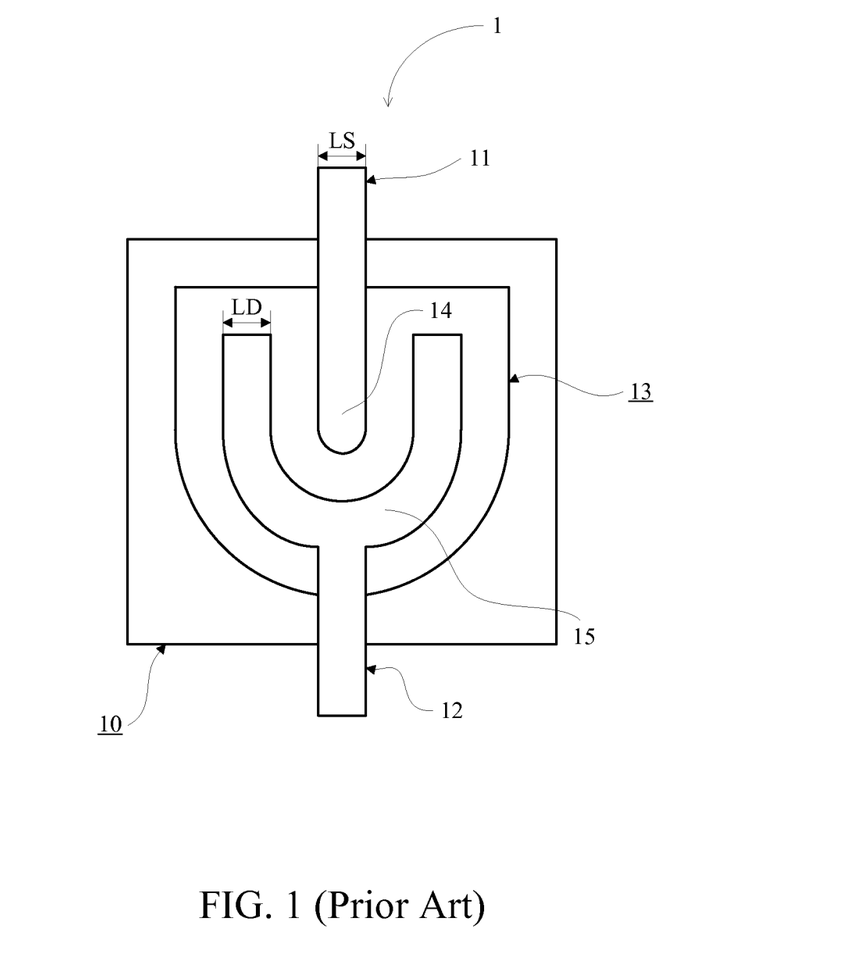
FIG. 1 is a schematic diagram illustrating an electrode structure of a thin film transistor of the prior art.

As shown in FIG. 1, generally, an electrode structure of a thin-film transistor 1 comprises a gate electrode 10, a source electrode 11, a drain electrode 12, and a semiconductor layer 13. The semiconductor layer 13 is formed above the gate electrode 10 while the source electrode 11 and the drain electrode 12 are formed above a portion of the semiconductor layer 13 and are separated to each other, individually overlapping to a portion of the gate electrode 10. Generally, a width LS of the source electrode and a width LD of the drain electrode are about 4 um. Using this size of the electrode structure in a thin-film transistor so as to control the turn on/off of the pixels is achieved.

However, while current flows through the drain electrode 12 to the source electrode 11, a current flowing from an arc portion 15 of the drain electrode 12 can flow into a circular portion 14 of the source electrode 11 only. Compared to the arc portion 15 of the drain electrode 12, the circular portion 14 of the source electrode 11 has a relatively restricted overlapping area. The circular portion 14 is easily influenced by semiconductor process varieties which further resist normal current flow. This seriously affects the current amount and results in unstable current.

Consequently, increasing and stabilizing the amount of current that flows through the drain electrode 12 to the source electrode 11 without negatively affecting the TFT electrical transmission within displays a necessary objective to endeavor and improve upon.

SUMMARY OF THE INVENTION

The primary objective of the present invention is to provide an electrode structure of a transistor to increase and stabilize an amount of current transmitted between electrodes by changing the related size of the two electrodes among these electrodes.

The above-mentioned electrode structure of the present invention comprises a first electrode and a second electrode. The first electrode has at least two first portions and at least one second portion. The first portions are substantially parallel with each other and each of these portions has a first width. The second portion has a second width, and is connected to the substantially parallel first portions to define a space with an opening. The second electrode via the opening is disposed in part of the space. The first width is substantially greater than the second width.

Another embodiment for achieving the said objective is an electrode structure of the present invention comprising a first electrode and a second electrode, wherein the first electrode has at least two first portions and at least one second portion. The first portions are substantially parallel with each other and each has a first width. The second portion has a second width, and is connected to the substantially parallel first portions to define a space with an opening. The second portion has a body and an end portion, wherein the end portion via the opening is disposed in part of the space. The width of the end portion is substantially greater than the width of the body.

Another objective of the present invention is to provide a pixel structure comprising any of the above-mentioned of the electrode structures of the transistor.

Yet a further objective of the present invention is to provide a display apparatus comprising any of the above-mentioned of the electrode structure of the transistor.

By changing the electrode width of the electrode structure of the transistor, the present invention can increase and stabilize the current transmitted between electrodes. Furthermore, the channel lengths between electrodes remain constant to follow the original design rules. Consequently, the objective to increase and stabilize the amount of current can be achieved without changing the original design rules.

The detailed technology and preferred embodiments implemented for the subject invention are described in the following paragraphs accompanying the appended figures for those skilled in this field to well appreciate the features of the claimed invention.

DESCRIPTION OF THE PREFERRED EMBODIMENT

For convenience of understanding, the first electrode and the second electrode described in the claims are explained by common used drain electrode and source electrode.

Figure 2A:
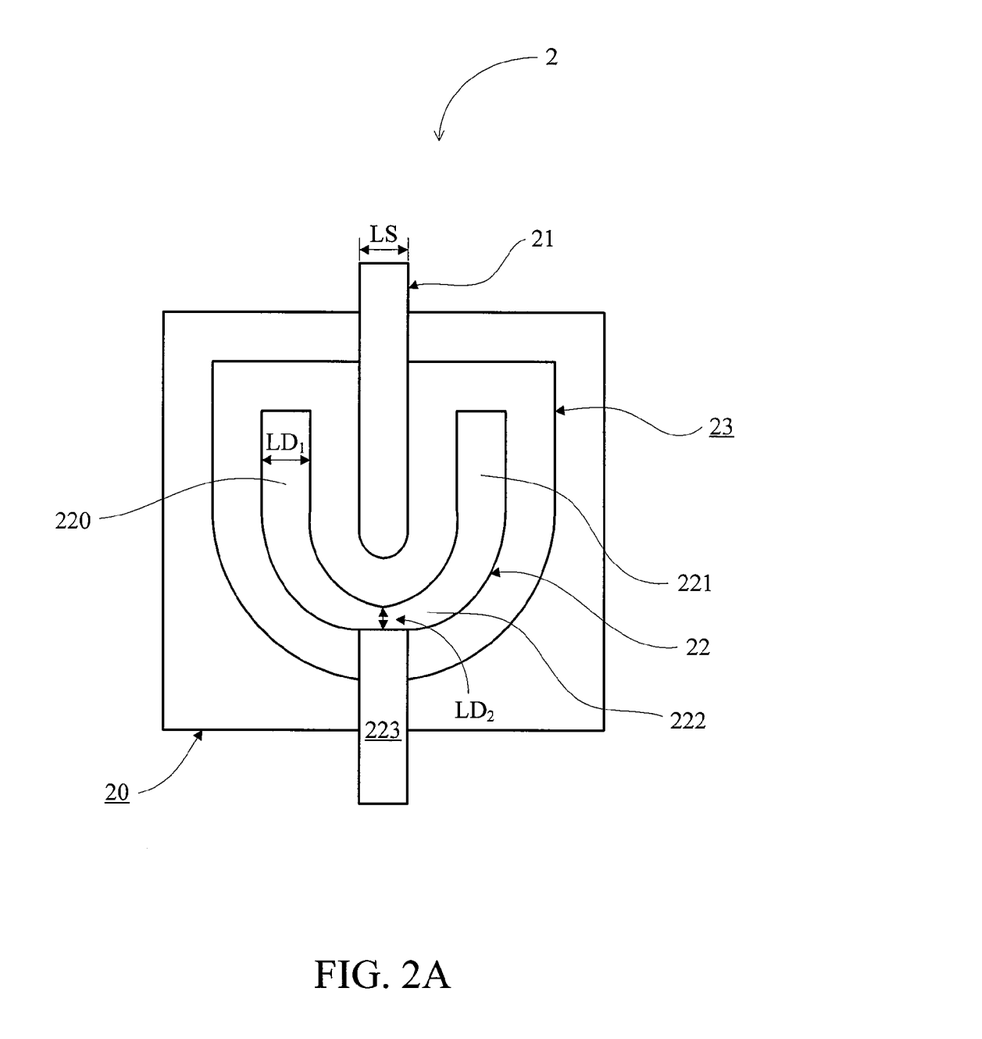
FIG. 2A is a schematic diagram illustrating a first embodiment of an electrode structure of the present invention.
Figure 2B:
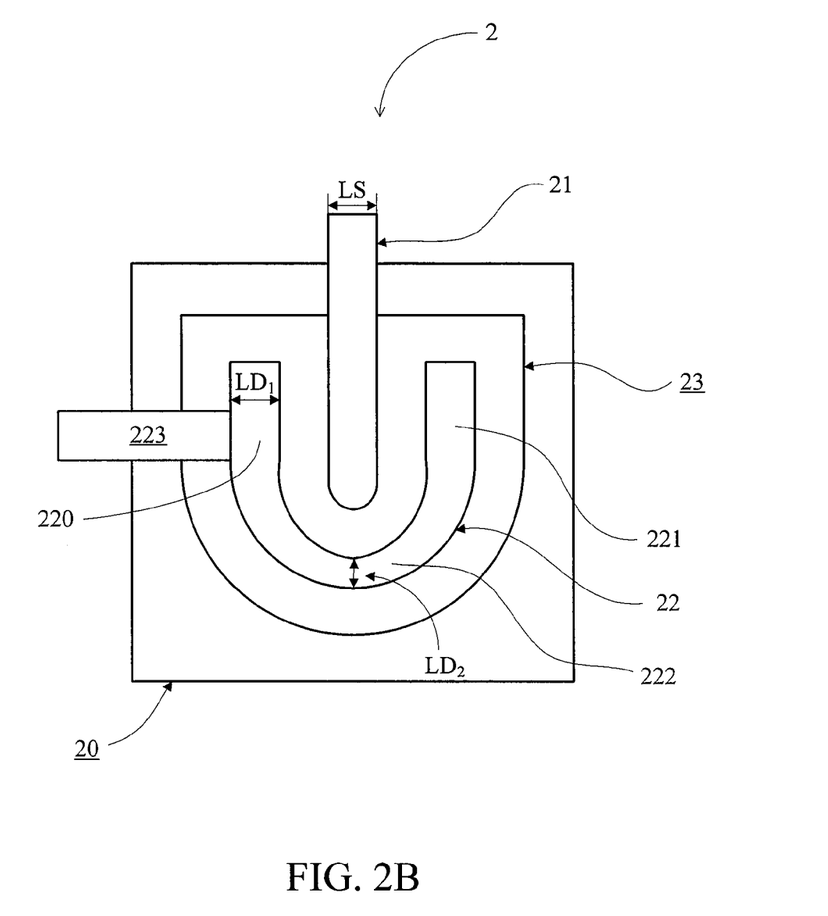
FIG. 2B is a schematic diagram illustrating the first embodiment of the electrode structure of the present invention with a connecting section located in another position.

A first embodiment of the present invention as shown in FIG. 2A and FIG. 2B is an electrode structure 2 of a transistor which comprises a gate electrode 20, a source electrode 21, a drain electrode 22, and a predetermined material layer 23. The predetermined material layer 23 is formed above the gate electrode 20 while the source electrode 21 and the drain electrode 22 are formed above a portion of the predetermined material layer 23, and are separated to each other, each individually overlapping a portion of the gate electrode 20. The drain electrode 22 has two first portions 220, 221, a second portion 222, and a connecting section 223. The first portions 220, 221 are substantially parallel with each other, and each first portion has a first width $LD_1$. The second portion 222 has a second width $LD_2$, and is connected to the first portions 220, 221 so that the drain electrode 22 can define a space with an opening. In the present embodiment of the invention, the first width $LD_1$ is substantially greater than the second width $LD_2$.

One form of the electrode structure 2 of the transistor from the first embodiment of the present invention is shown in FIG. 2A. The connecting section 223 of the drain electrode 22 is connected to the second portion 222. Another form is shown in FIG. 2B, where the connecting section 223 of the drain electrode 22 is connected to at least one of the first portions 220, 221. In the present embodiment of the invention, the width LS of the source electrode 21 is substantially equal to the first width $LD_1$.

Each parameter in the first embodiment of the present invention is explained by the following descriptive example. The first width $LD_1$ and the width LS of the source electrode 21 are substantially 4 micrometers (um), and the second width $LD_2$ substantially range from 2 um to 3.8 um. Consequently, the first width $LD_1$ and the second width $LD_2$ have a difference range from about 0.2 um to about 2 um, and the width LS of the source electrode 21 and the second width $LD_2$ have a difference range from about 0.2 um to about 2 um. In other words, the second width $LD_2$ is substantially equal to the first width $LD_1$ minus a difference of at least about 0.2 um which can be represented by the following equation: $LD_2=LD_1-n$, wherein n is a natural number substantially greater than or substantially equal to 0.2. For example, if n=0.2, $LD_1$=4, then $LD_2$=3.8; if n=1, $LD_1$=4, then $LD_2$=3; if n=0.4, $LD_1$=5, then $LD_2$=4.6; if n=1.25, $LD_1$=4, then $LD_2$=2.75; if n=1, $LD_1$=3, then $LD_2$=2, wherein these values can be changed according to design requirements or design rules. Note that the second width $LD_2$ can also be calculated by subtracting the width LS of the source electrode 21 by a difference of at least about 0.2 um which can be represented by the following equation: $LD_2=LS-n$, wherein n is a natural number substantially greater than or substantially equal to 0.2. After calculation, it is known that the ratio of the first width $LD_1$ and the second width $LD_2$ is substantially 1.05 to 2, and the ratio of the width LS of the source electrode 21 and the second width $LD_2$ is substantially 1.05 to 2 as well.

Figure 3A:
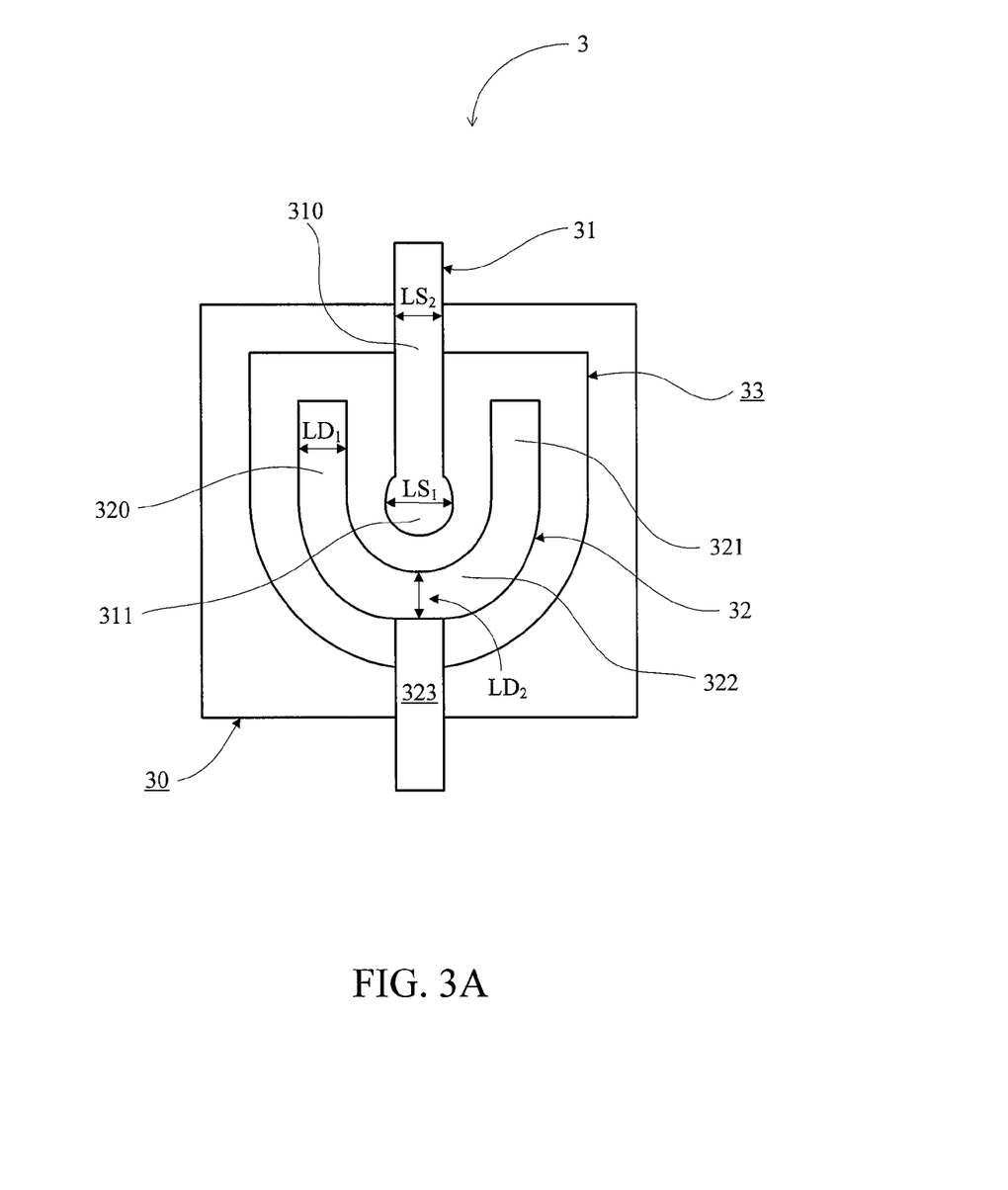
FIG. 3A is a schematic diagram illustrating a second embodiment of an electrode structure of the present invention.
Figure 3B:
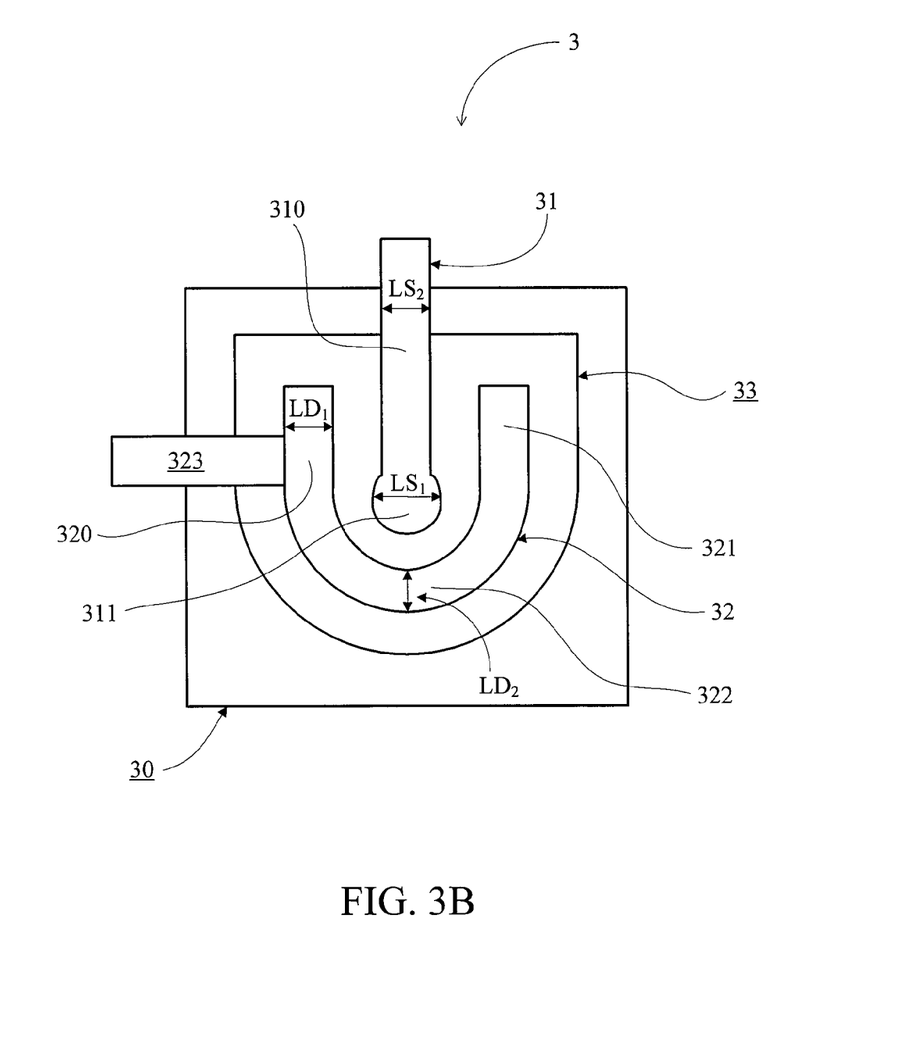
FIG. 3B is a schematic diagram illustrating the second embodiment of the electrode structure of the present invention with a connecting section located in another position.

A second embodiment of the present invention as shown in FIG. 3A and FIG. 3B is an electrode structure 3 of a transistor which comprises a gate electrode 30, a source electrode 31, a drain electrode 32, and a predetermined material layer 33. The predetermined material layer 33 is formed above the gate electrode 30 while the source electrode 31 and the drain electrode 32 are formed above a portion of the predetermined material layer 33, and are separated to each other, each individually overlapping a portion of the gate electrode 30. The drain electrode 32 has two first portions 320, 321, a second portion 322, and a connecting section 323. The first portions 320, 321 are substantially parallel with each other, and each first portion has a first width $LD_1$. The second portion 322 has a second width $LD_2$, and is connected to the first portions 320, 321, so that the drain electrode 32 can define a space with an opening. The source electrode 31 has a body 310 and an end portion 311, wherein the end portion 311 is substantially disposed in part of the space via the opening defined by the drain electrode 32. In the present embodiment of the invention, the first width $LD_1$ is substantially equal to the second width $LD_2$. The width $LS_1$ of the end portion 311 is substantially greater than the width $LS_2$ of the body 310, and the width $LS_1$ of the end portion 311 is substantially greater than the first width $LD_1$ and the second width $LD_2$.

One form of the electrode 3 structure of the transistor mentioned in the second embodiment of the present invention is shown in FIG. 3A. The connecting section 323 of the drain electrode 32 is connected to the second portion 322. Another form is shown in FIG. 3B where the connecting section 323 of the drain electrode 32 is connected to at least one of the first portions 320, 321.

Each parameter in the second embodiment is explained by the following descriptive example. The first width $LD_1$ and the second width $LD_2$ are substantially 4 um, the width $LS_1$ of the end portion 311 of the source electrode 31 substantially ranges from 4.2 um to 8 um, and the width $LS_2$ of the body 310 of the source electrode 31 substantially ranges from 4 um to 6 um. Consequently, the width $LS_1$ of the end portion 311 and the width $LS_2$ of the body 310 have a difference range from about 0.2 um to about 4 um, and the width $LS_1$ of the end portion 311 and the first width $LD_1$ have a difference range from about 0.2 um to about 4 um. In other words, the width $LS_1$ of the end portion 311 is substantially equal to the width $LS_2$ of the body 310 plus a difference of at least about 0.2 um which can be represented by the following equation: $LS_1=LS_2+n$, wherein n is a natural number substantially greater than or substantially equal to 0.2. For example, if n=0.2, $LS_2$=4, then $LS_1$=4.2; if n=1, $LS_2$=4, then $LS_1$=5; if n=0.2, $LS_2$=6, then $LS_1$=6.2; if n=1.25, $LS_2$=4, then $LS_1$=5.25; if n=1, $LS_2$=3, then $LS_1$=4, wherein these values can be changed according to design requirements or design rules. Note that the width $LS_1$ of the end portion 311 can also be calculated by adding the first width $LD_1$ by a difference of at least about 0.2 um which can be represented by the following equation: $LS_1=LD_1+n$, wherein n is a natural number substantially greater than or substantially equal to 0.2. After calculation, it is known that the ratio of the width $LS_1$ of the end portion 311 and the width $LS_2$ of the body 310 is substantially 0.7 to 2 and the ratio of the width $LS_1$ of the end portion 311 and the first width $LD_1$ is substantially 1.05 to 2.

Figure 4A:
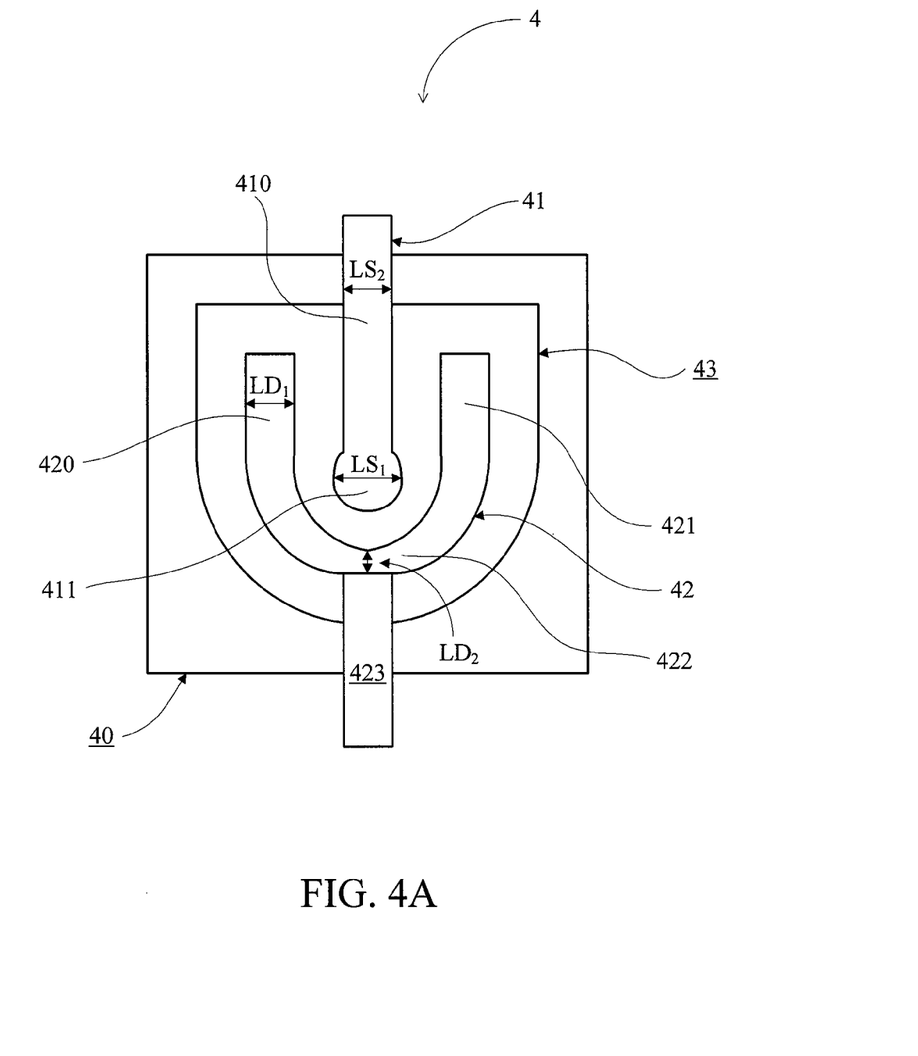
FIG. 4A is a schematic diagram illustrating a third embodiment of an electrode structure of the present invention.
Figure 4B:
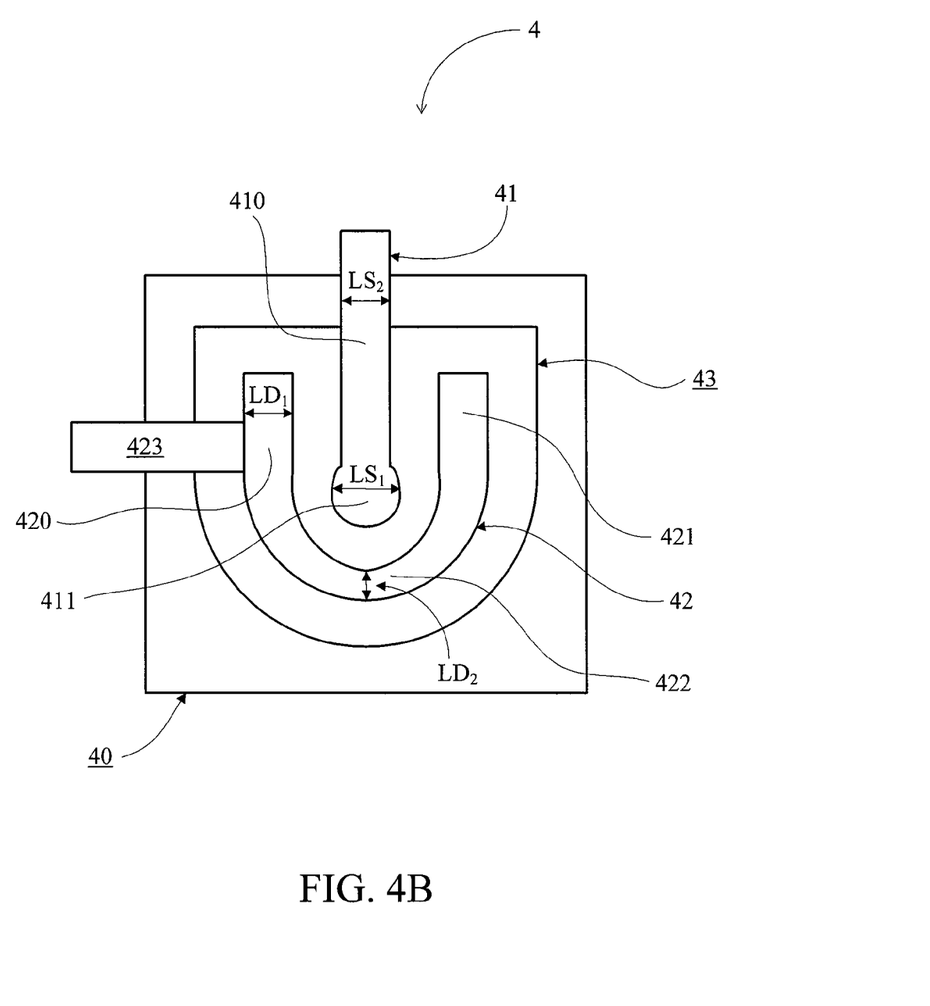
FIG. 4B is a schematic diagram illustrating the third embodiment of the electrode structure of the present invention with a connecting section located in another position.

The third embodiment of the present invention as shown in FIG. 4A and FIG. 4B is an electrode structure 4 of a transistor which comprises a gate electrode 40, a source electrode 41, a drain electrode 42, and a predetermined material layer 43. The predetermined material layer 43 is formed above the gate electrode 40 while the source electrode 41 and the drain electrode 42 are formed above a portion of the predetermined material layer 43, and are separated to each other, each individually overlapping a portion of the gate electrode 40. The drain electrode 42 has two first portions 420, 421, a second portion 422, and a connecting section 423. The first portions 420, 421 are substantially parallel with each other, and each first portion has a first width $LD_1$. The second portion 422 has a second width $LD_2$, and is connected to the first portions 420, 421, so that the drain electrode 42 can define a space with an opening. The source electrode 41 has a body 410 and an end portion 411, wherein the end portion 411 is disposed in part of the space via the opening defined by the drain electrode 42. In the present embodiment of the invention, the first width $LD_1$ is substantially greater than the second width $LD_2$. The width $LS_1$ of the end portion 411 is substantially greater than the width $LS_2$ of the body 410, and the width $LS_1$ of the end portion 411 is substantially greater than the first width $LD_1$.

One form of the electrode structure 4 of the transistor mentioned in the third embodiment of the present invention is shown in FIG. 4A. The connecting section 423 of the drain electrode 42 is connected to the second portion 422. Another form is shown in FIG. 4B where the connecting section 423 of the drain electrode 42 is connected to at least one of the first portions 420, 421.

Each parameter in the third embodiment of the present invention is explained by the following descriptive example. The first width $LD_1$ is substantially 4 um. The second width $LD_2$ substantially ranges from 2 um to 3.8 um. The width $LS_1$ of the end portion 411 of the source electrode 41 substantially ranges from 4.2 um to 8 um, and the width $LS_2$ of the body 410 of the source electrode 41 substantially ranges from 4 um to 6 um. Consequently, the width $LS_1$ of the end portion 411 and the width $LS_2$ of the body 410 have a difference range from about 0.2 um to about 4 um. The width $LS_1$ of the end portion 411 and the first width $LD_1$ have a difference range from about 0.2 um to about 4 um and the first width $LD_1$ and the second width $LD_2$ have a difference range from about 0.2 um to about 2 um. In other words, the width $LS_1$ of the end portion 411 is substantially equal to the width $LS_2$ of the body 410 plus a difference of at least about 0.2 um which can be represented by the following equation: $LS_1=LS_2+n$, wherein n is a natural number substantially greater than or substantially equal to 0.2. For example, if n=0.2, $LS_2=4$, then $LS_1=4.2$; if n=1, $LS_2=4$, then $LS_1=5$; if n=0.2, $LS_2=6$, then $LS_1=6.2$; if n=1.25, $LS_2=4$, then $LS_1=5.25$; if n=1, $LS_2=3$, then $LS_1=4$, wherein these values can be changed according to design requirements or design rules. Note that the width $LS_1$ of the end portion 411 can also be calculated by adding the first width $LD_1$ by a difference of at least about 0.2 um which can be represented by the following equation: $LS_1=LD_1+n$, wherein n is a natural number substantially greater than or equal to 0.2. The second width $LD_2$ is substantially equal to the first width $LD_1$ subtracted by a difference of at least about 0.2 um which can be represented by the following equation: $LD_2=LD_1-n$, wherein n is a natural number substantially greater than or substantially equal to 0.2. For example, if n=0.2, $LD_1=4$, then $LD_2=3.8$; if n=1, $LD_1=4$, then $LD_2=3$; if n=0.4, $LD_1=5$, then $LD_2=4.6$; if n=1.25, $LD_1=4$, then $LD_2=2.75$; if n=1, $LD_1=3$, then $LD_2=2$, wherein these values can be changed according to design requirements or design rules. Note that the second width $LD_2$ can also be calculated by subtracting the width $LS_2$ of the body 410 by a difference of at least about 0.2 um which can be represented by the following equation: $LD_2=LS_2-n$, wherein n is a natural number substantially greater than or substantially equal to 0.2. After calculation, it is known that the ratio of the width $LS_1$ of the end portion 411 and the width $LS_2$ of the body 410 is substantially 0.7 to 2, the ratio of the width $LS_1$ of the end portion 411 and the first width $LD_1$ is substantially 1.05 to 2, and the ratio of the first width $LD_1$ and the second width $LD_2$ is substantially 1.05 to 2.

Figure 5:
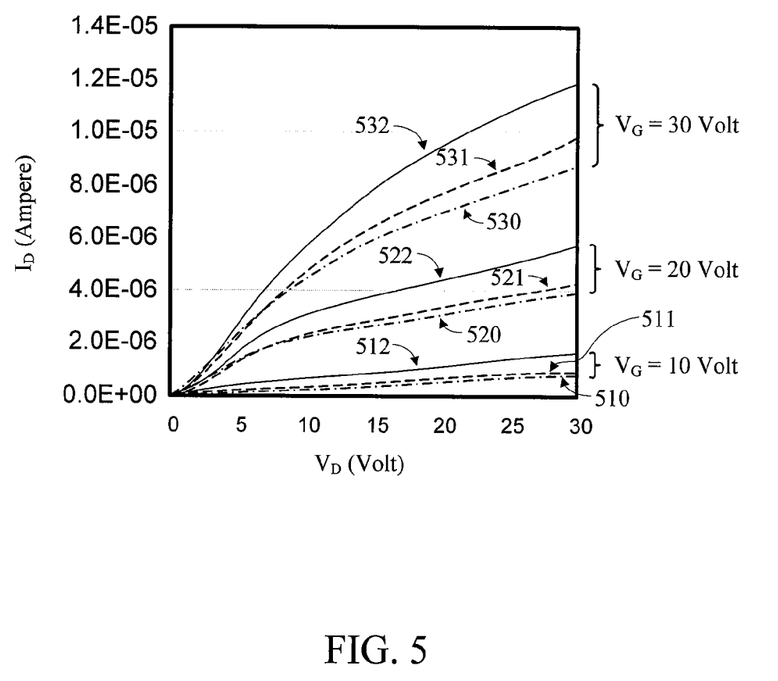
FIG. 5 is an experimental curve of a drain electrode current $I_D$ versus a drain electrode voltage $V_D$ among various transistors.
Figure 6:
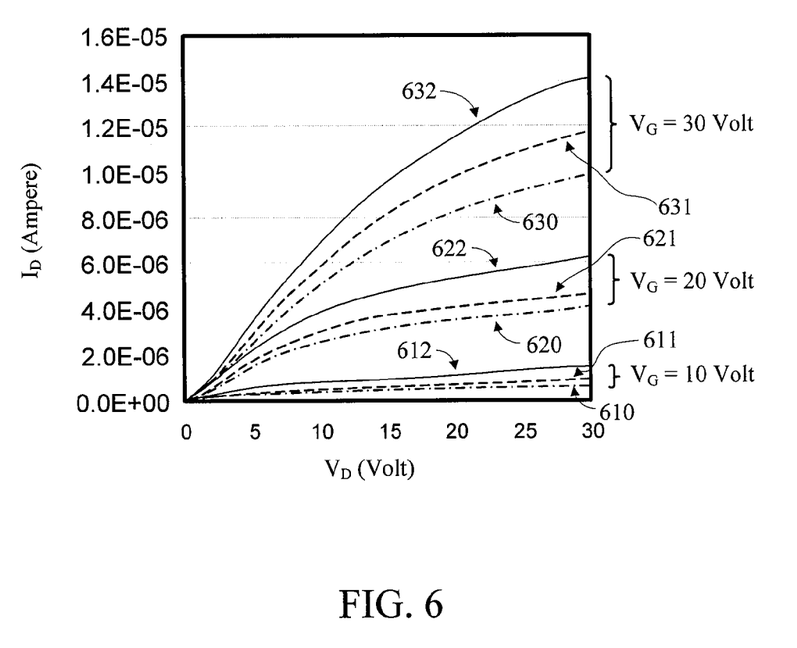
FIG. 6 is another experimental curve of the drain electrode current $I_D$ versus the drain electrode voltage $V_D$ among various transistors.

FIG. 5 and FIG. 6 show the curves of the drain electrode current ($I_D$) versus the drain electrode voltage ($V_D$) while controlling on/off states of pixels for various forms of transistors, wherein FIG. 5 shows the curve of $I_D$ versus $V_D$ while display pixels are all dark, and FIG. 6 shows the curve of $I_D$ versus $V_D$ while display pixels have an unit luminance strength of 5000 nits.

For a more detailed description, please refer to FIG. 5. The symbols 510, 511, 512 are curves of $I_D$ versus $V_D$ for various forms of transistors while the gate electrode voltage ($V_G$) is 10 volts, wherein the symbol 510 represents the transistor of the electrode structure 1 of FIG. 1, the symbol 511 represents the transistor of the electrode structure 2 of FIG. 2A, and the symbol 512 represents the transistor of the electrode structure 4 of FIG. 4A. Symbols 520, 521, 522 are curves of $I_D$ versus $V_D$ for various forms of transistors while $V_G$ is 20 volts, wherein the symbols 520, 521, 522 respectively represents the transistor of the electrode structure 1 of FIG. 1, the electrode structure 2 of FIG. 2A, and the electrode structure 4 of FIG. 4A. The symbols 530, 531, 532 represent similar results while $V_G$ is 30 volts.

Referring to FIG. 6, symbols 610, 611, 612 are curves of $I_D$ versus $V_D$ for various forms of transistors while the gate electrode voltage ($V_G$) is 10 volts, wherein the symbol 610 represents the transistor of the electrode structure 1 of FIG. 1, the symbol 611 represents the transistor of the electrode structure 2 of FIG. 2A, and the symbol 612 represents the transistor of the electrode structure 4 of FIG. 4A. Symbols 620, 621, 622 are curves of $I_D$ versus $V_D$ for various forms of transistors while $V_G$ is 20 volts, wherein the symbols 620, 621, 622 respectively represent the transistor of the electrode structure 1 of FIG. 1, the electrode structure 2 of FIG. 2A, and the electrode structure 4 of FIG. 4A. The symbols 630, 631, 632 represent similar results while $V_G$ is 30 volts.

While performing the above mentioned various experiments, referenced sizes of the transistors of the electrode structures are listed as follows. For the transistors of electrode structure 1 in FIG. 1, the width LS of the source electrode 11 and the width LD of the drain electrode 12 are both 4 um. For the transistors of electrode structure 2 in FIG. 2A, the width LS of the source electrode 21 and the first width $LD_1$ of the drain electrode 22 of are both 4 um, and the second width $LD_2$ of the drain electrode 22 is 3 um. For the transistors of electrode structure 4 in FIG. 4A, the width $LS_2$ of the body 410 of the source electrode 41 and the first width $LD_1$ of the drain electrode 42 are both 4 um, the width $LS_1$ of the end portion 411 of the source electrode 41 is 5 um, and the second width $LD_2$ of the drain electrode 42 is 3 um.

According to FIG. 5 and FIG. 6 mentioned above as compared to the prior art (FIG. 1), transistors adopting the electrode structures of the present invention characteristics (as shown in FIG. 2A, 4A) can significantly increase current amount transmitted between electrodes (i.e. between above mentioned drain electrode and source electrode).

Figure 7:
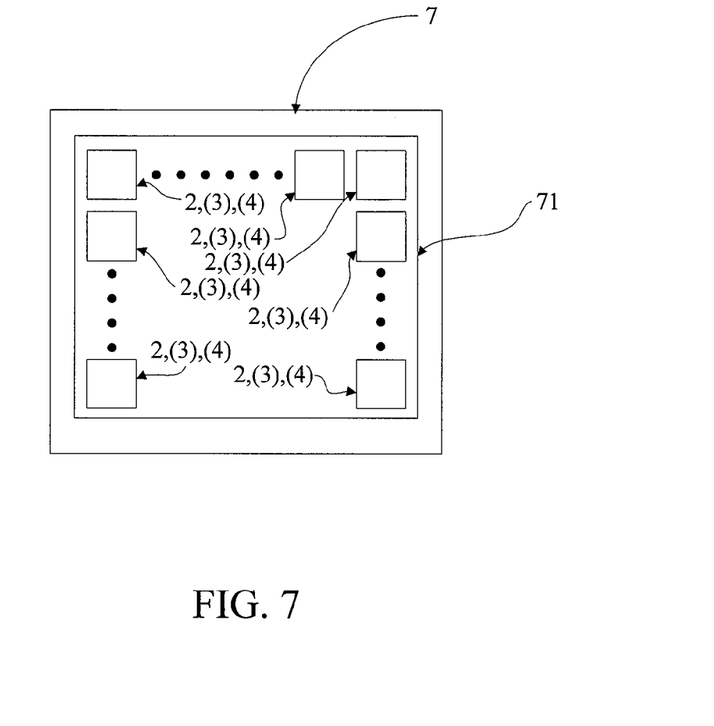
FIG. 7 is a relation schematic illustrating an electrode structure and a display apparatus of the present invention.

Referring to FIG. 7, all the electrode structures 2, 3, 4 of the transistor of the first embodiment, the second embodiment, and the third embodiment as described above can be used in a display apparatus 7, wherein the display apparatus 7 comprises a pixel structure 71 which further comprises a signal line (not shown) connecting the connecting section 223, 323, 423 of the drain electrode 22, 32, 42 in the different embodiments. This display apparatus may comprises a screen, a television, a laptop, a touch panel, a display of a portable electronic product (such as a mobile phone, a digital camera, a digital camcorder, a digital audio/video player, a digital assistant (such as a personal digital assistant (PDA), a black berry, or other similar products), a handy game machine (such as GameBoy, Playstation Portable (PSP), Nintendo DS Lite, or other similar game machines), an automotive audio/video apparatus, an outdoor or indoor display. Except for the application types of the above mentioned display apparatus, various kinds of display apparatus also included may comprise an organic light-emitting diodes display (OLED), a plasma display panel (PDP), a liquid crystal display (LCD), and a field emission display (FED). The above descriptions explain only the electrode structure of the invention characteristic. For the common architectures of the pixel structure and display apparatus, there are no unnecessary details given here because these are not invention characteristics, and those skilled in the art can understand these technical architectures.

Furthermore, the above-mentioned figures of embodiments show an almost U-type example for the drain electrode. However, this type of the drain electrode is not limited to this application. All types that can be covered by the descriptions of the embodiments of the present invention can be replacements, such as C type or the like. In addition, the transistor types suitable for the electrode structure comprise bottom-gate (such as back channel etching (BCE), etching-stopper), top-gate, or other similar types. Furthermore, the predetermined material layer of the embodiments of the present invention is explained by a semiconductor layer and is not limited to this type. A dielectric layer or combinations of the above-mentioned materials are also included. The material of the semiconductor layer comprises amorphous silicon, polysilicon, microcrystalline silicon, monocrystalline crystal, or combinations thereof, and the semiconductor layer can be doped by N-type doping, P-type doping, or combinations thereof. When the semiconductor layer is doped, the doping can be lateral doping or vertical doping on a portion of the semiconductor layer, and the thickness of the doping can be increased or decreased in either lateral or vertical directions. However, the semiconductor layer can also be divided into several sub-layer and the doping can be doped into at least one sub-layer. The material for the dielectric layer comprises inorganic compounds (such as silicon nitride, silicon oxide, silicon oxynitride, silicon carbide, or the like), organic compounds (such as BCB, photoresist, polyimide, polyester, polyalcohol, or the like), or combinations thereof.

Furthermore, mentioned figures of embodiments all show that the widths of the gate electrode 20, 30, 40 are substantially greater than the widths of the predetermined material layer 23, 33, 43 as examples. However, the widths of the gate electrode 20, 30, 40 can be substantially less than or substantially equal to the widths of the predetermined material layer 23, 33, 43. In other words, the embodiments show that the areas of the gate electrode 20, 30, 40 are substantially greater than the areas of the predetermined material layer 23, 33, 43 as examples. However, the areas of the gate electrode 20, 30, 40 can be substantially less than or substantially equal to the areas of the predetermined material layer 23, 33, 43. Furthermore, figures of mentioned embodiments all use 4 um for the first width $LD_1$, the width LS of the source electrode 21, the width $LS_2$ of the body 310, 410 of the source electrode 31, 41 as example and experimental results. However, if the design rules said in the present invention can be met and the resolution of the machine can be satisfied, the descriptions of the electrode structure such as the first width $LD_1$, the width LS of the source electrode 21, the width $LS_2$ of the body 310, 410 of the source electrode 31, 41 can adopt other sizes such as 3 um, 3.5 um, 2 um, 1 um, 1.25 um, or others. Moreover, the above-mentioned embodiments of the present invention further comprising a dielectric layer (not shown) formed between the gate electrode 20, 30, 40 and the predetermined material layer 23, 33, 43.

According to the above descriptions, while manufacturing transistors in the present invention, the fixed electrode width in the original electrode structure of the transistor is changed to increase and stabilize the amount of current transmitted between electrodes (i.e. the drain electrode and the source electrode mentioned above), and further maintains the channel length between electrodes to follow original design rules in industry. For example, the distance between the drain electrode 22, 32, 42 and the source electrode 21, 31, 41 is maintained at about 4 um. Consequently, an objective in technology breakthrough is achieved without modifying the design rules.

The above disclosure is related to the detailed technical contents and inventive features thereof. Those skilled in this field may proceed with a variety of modifications and replacements based on the disclosures and suggestions of the invention as described without departing from the characteristics thereof. Rather, it is intended to cover various modifications and similar arrangements included within the spirit and scope of the appended claims, the scope of which should be accorded the broadest interpretation so as to encompass all such modifications and similar structure.

What is claimed is:

1. An electrode structure of a transistor, comprising:
a first electrode, having:
two first portions including opposing exterior side surfaces which are substantially parallel with each other, and each of the first portions having an equal first width which is defined in a transverse direction being relative to a lengthwise dimension which is greater than the first width; and
a second portion including a curved side surface, the second portion having a second width which is defined in a transverse direction being relative to a lengthwise dimension which is greater than the second width, the second portion connecting between the two first portions to define the first electrode having a space with an opening; and
a second electrode disposed in part of the space through the opening;
wherein the first width is substantially greater than the second width.

2. The electrode structure of claim 1, wherein the first electrode has a connecting section connected to at least one of the first portions.

3. The electrode structure of claim 1, wherein the first electrode has a connecting section connected to the second portion.

4. The electrode structure of claim 1, wherein a ratio of the first width and the second width ranges from about 1.05 to about 2.

5. The electrode structure of claim 1, wherein the first width and the second width has a difference ranges from about 0.2 um to about 2 um.

6. The electrode structure of claim 1, wherein the second electrode has a width smaller than another lengthwise dimension of the second electrode, and the width of the second electrode is substantially equal to the first width of each of the first portions.

7. The electrode structure of claim 6, wherein a ratio of the width of the second electrode and the second width ranges from about 1.05 to about 2.

8. The electrode structure of claim 6, wherein the width of the second electrode and the second width has a difference ranges from about 0.2 um to about 2 um.

9. The electrode structure of claim 1, wherein the first width is substantially 4 um.

10. The electrode structure of claim 1, wherein the second width ranges from about 2 um to about 3.8 um.

11. A pixel structure incorporating the electrode structure of the transistor of claim 1.

12. The pixel structure of claim 11, wherein the first electrode has a connecting section connected to at least one of the first portions.

13. The pixel structure of claim 12, further comprising a signal line connected to the connecting section.

14. The pixel structure of claim 11, wherein the first electrode has a connecting section connected to the second portion.

15. A display apparatus incorporating the electrode structure of the transistor of claim 1.

\* \* \* \* \*